United States Patent [19]
Roh

[11] Patent Number: 5,569,619
[45] Date of Patent: Oct. 29, 1996

[54] METHOD FOR FORMING A CAPACITOR OF A SEMICONDUCTOR MEMORY CELL

[75] Inventor: Jae-sung Roh, Kyunggi-do, Rep. of Korea

[73] Assignee: LG Semicon Co., Ltd., Cheongju, Rep. of Korea

[21] Appl. No.: 395,260

[22] Filed: Feb. 28, 1995

Related U.S. Application Data

[63] Continuation-in-part of Ser. No. 83,120, Jun. 24, 1993, abandoned.

[30]     Foreign Application Priority Data

Jun. 24, 1992 [KR]   Rep. of Korea ...................... 92-11008

[51] Int. Cl.⁶ .............................................. H01L 21/8242
[52] U.S. Cl. ................................ 437/52; 437/60; 437/919
[58] Field of Search ................................. 437/47, 48, 52, 437/60, 919, 241; 257/310

[56]             References Cited

U.S. PATENT DOCUMENTS

| | | | |
|---|---|---|---|
| 4,495,219 | 1/1985 | Kato et al. ................................. | 427/82 |
| 4,734,340 | 3/1988 | Saito ....................................... | 428/698 |
| 4,891,684 | 1/1990 | Nishioka et al. ........................ | 437/919 |
| 5,079,191 | 1/1992 | Shinriki .................................. | 437/235 |
| 5,202,280 | 4/1993 | Kamiyama et al. ..................... | 437/47 |

*Primary Examiner*—Tom Thomas
*Attorney, Agent, or Firm*—Alan R. Loudermilk

[57]             ABSTRACT

A method for forming a capacitor of a memory cell is disclosed. Steps of the present invention may include: forming a first conductive layer on a substrate; forming a tantalum oxide layer on the first conductive layer; forming a silicon nitride layer on the tantalum oxide layer; carrying out a titanium ion implantation into the tantalum oxide layer; carrying out a heat treatment, which may form a silicon oxide layer between the first conductive layer and the tantalum oxide layer, and which may include titanium oxide in the tantalum oxide layer, and which may change the silicon nitride to an oxynitride layer; and forming a second conductive layer on the oxynitride layer. During the titanium ion implantation process, $Ti(OCH_3)_4$ may be used as a titanium ion source. The titanium ion implantation process may be carried out using the $Si_3N_4$ layer as a buffer layer, and with an energy of about 5 KeV–15 KeV, and a dosage of about $10^{13}$–$10^{16}$.

16 Claims, 2 Drawing Sheets

METHOD FOR FORMING A CAPACITOR OF A SEMICONDUCTOR MEMORY CELL

This is a continuation-in-part of application Ser. No. 08/083,120, filed Jun. 24, 1993, now abandoned which is hereby incorporated by reference.

FIELD OF THE INVENTION

The present invention relates to a method for forming a capacitor of a semiconductor memory cell, and more particularly to a method for forming a capacitor of a semiconductor memory which includes the steps of depositing a silicon nitride layer on a dielectric layer of $Ta_2O_5$ and oxidizing the silicon nitride layer, which can serve to present leakage current through the dielectric layer of the capacitor.

BACKGROUND OF THE INVENTION

Generally, $Ta_2O_5$ has been considered for use as the dielectric layer of a memory cell capacitor. $Ta_2O_5$ has a dielectric constant of 25, which is about 3 to 6 times higher as compared with 3.9 for a silicon dioxide layer and 7.5 for a silicon nitride layer. Therefore, this material is being studied as a substitute material for the stacked structure of silicon nitride/silicon dioxide layers.

That is, with $Ta_2O_5$ having a high dielectric constant, the capacitance of a capacitor having a dielectric layer consisting of $Ta_2O_5$ can be increased as compared with a capacitor having a dielectric layer consisting of silicon nitride or silicon dioxide. Alternatively, for a given capacitance, the area of the capacitor can be reduced using $Ta_2O_5$ as the dielectric layer. For such reasons $Ta_2O_5$ has been considered promising for potential use in 64M or 256M DRAMs.

However, $Ta_2O_5$ dielectric layers have not been successfully put to practical use at present. A reason for this is that, while the $Ta_2O_5$ layer blocks efficiently the movement of electrons, positive holes may move easily in $Ta_2O_5$. As a result, leakage current through the $Ta_2O_5$ layer can be high.

A conventional technique for lowering the leakage current is focused on annealing after the deposition of the $Ta_2O_5$. The most widely used annealing method is a dry-oxidization using a $UV-O_3$ or $O_2$ atmosphere. Also, instead of using doped poly-crystalline silicon, TiN has been used in an effort to get better results. In the case of positive bias, however, the reduction of the leakage current has not reached an acceptable value.

FIG. 1 illustrates a partial sectional view of a semiconductor having $Ta_2O_5$ layer 23 such as for use in a capacitor. That is, as shown in FIG. 1(A), first polysilicon layer 22, which is used for the first electrode (storage electrode) of the capacitor, is deposited on substrate 21, and then $Ta_2O_5$ dielectric layer 23 is deposited. Then, as shown in FIG. 1(B), dielectric layer 23 is dry-oxidized or heat-treated by using a $UV-O_3$ atmosphere.

Next, the second electrode of the capacitor (not shown) is formed by depositing a conductive material such as doped polysilicon or metal.

The dry-oxidation after depositing $Ta_2O_5$ dielectric layer 23 is performed so that oxygen is diffused into $Ta_2O_5$ dielectric layer 23' during the heat treatment, so that the internal defects of $Ta_2O_5$ dielectric layer 23' may be reduced. In such a case, silicon dioxide is formed between first polysilicon layer 22 (the first electrode) and $Ta_2O_5$ dielectric layer 23'. The silicon dioxide film impedes the flow of positive holes, while electrons easily pass by tunneling.

Current leakage is low in a negative direction bias in that the first electrode adjacent to the silicon dioxide is charged to a positive voltage, but the current leakage is increased in a positive direction bias in that the second electrode adjacent to the $Ta_2O_5$ layer is charged to a positive voltage, because the electrons can move through the silicon dioxide film by tunneling, and the positive holes can move easily through the $Ta_2O_5$ layer. Therefore, there remains a problem in using a $Ta_2O_5$ dielectric layer for the capacitor of memory cell.

SUMMARY OF THE INVENTION

The present invention is intended to overcome the above described disadvantages of the conventional technique.

Therefore, it is an object of the present invention to provide a method for forming a dielectric layer for use in a capacitor of a memory cell, which can reduce current leakage in the capacitor.

In achieving the above object, the process for forming a capacitor of a memory cell comprises the steps of depositing a silicon nitride layer upon a $Ta_2O_5$ dielectric layer, implanting titanium ions into the $Ta_2O_5$ dielectric layer, which is then dry-oxidized, thereby improving the current leakage characteristics.

A method for forming a capacitor of a semiconductor memory cell according to the present invention comprises the steps of: forming a first conductive layer on a substrate; forming a tantalum oxide layer on the first conductive layer; forming a silicon nitride layer on the tantalum oxide layer; carrying out a titanium ion implantation into the tantalum oxide layer; carrying out a heat treatment, which forms a silicon oxide layer between the first conductive layer and the tantalum oxide layer, which includes titanium oxide in the tantalum oxide layer, and which changes the silicon nitride to an oxynitride layer; and forming a second conductive layer on the oxynitride layer. During the titanium ion implanting process, $Ti(OCH_3)_4$ is used as a titanium ion source. The titanium ion implanting process may be carried out using the $Si_3N_4$ layer as a buffer layer, with an energy of about 5 KeV–15 KeV, and a dosage of about $10^{13}$–$10^{16}$.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

FIG. 2 illustrates a method of forming a dielectric layer on the capacitor electrode of a memory cell according to the present invention.

Figure 1A:
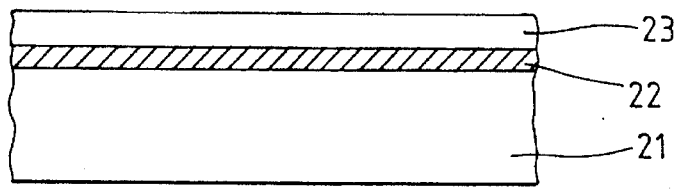
FIGS. 1 (A) and (B) illustrate the formation of a dielectric layer on a capacitor electrode in accordance with a conventional technique.
Figure 1B:
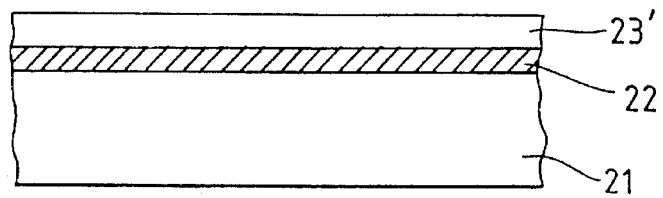
Figure 2A:
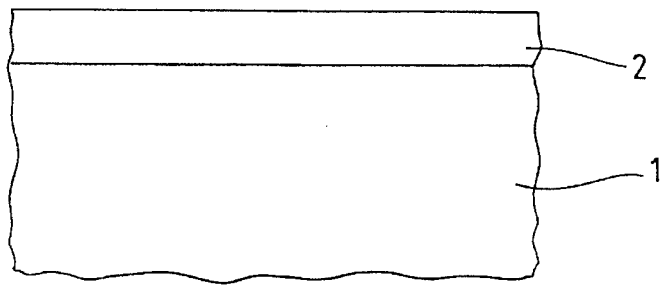
FIGS. 2 (A) to (E) illustrate the formation of a dielectric layer on a capacitor electrode in accordance with the present invention.

As illustrated in FIG. 2(A), first conductive layer 2, which functions as a first electrode of a capacitor, is deposited on substrate 1. First conductive layer 2 may be a doped polysilicon layer formed according to a conventional CVD method.

Figure 2B:
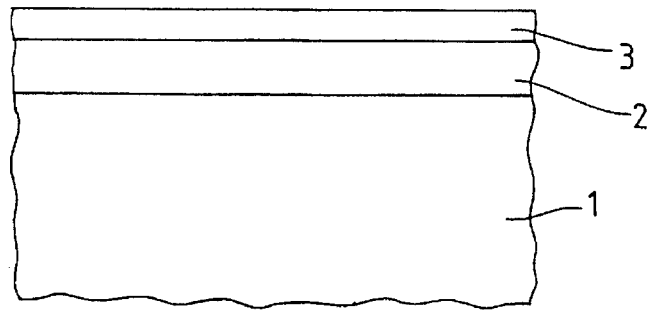

As illustrated in FIG. 2(B), tantalum oxide ($Ta_2O_5$) layer 3 is formed as a capacitor dielectric layer on first conductive layer 2 according to a CVD method or a reactive sputtering method.

Figure 2C:
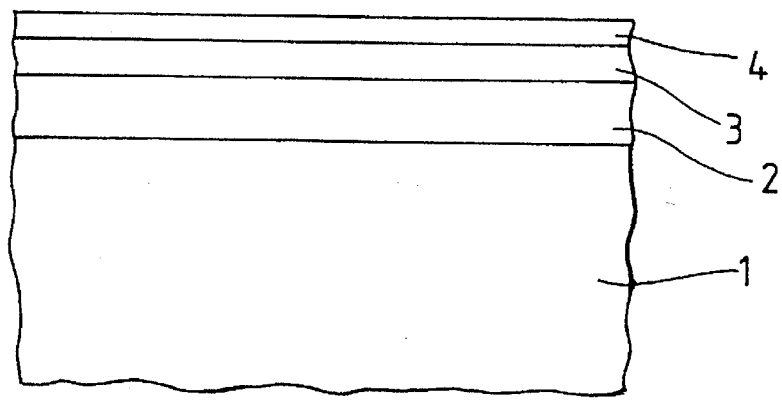

After the above step, as illustrated in FIG. 2(C), silicon nitride ($Si_3N_4$) layer 4, having a thickness of about 10–30 Å, is formed on $Ta_2O_5$ layer 3 according to a conventional CVD method.

Figure 2D:
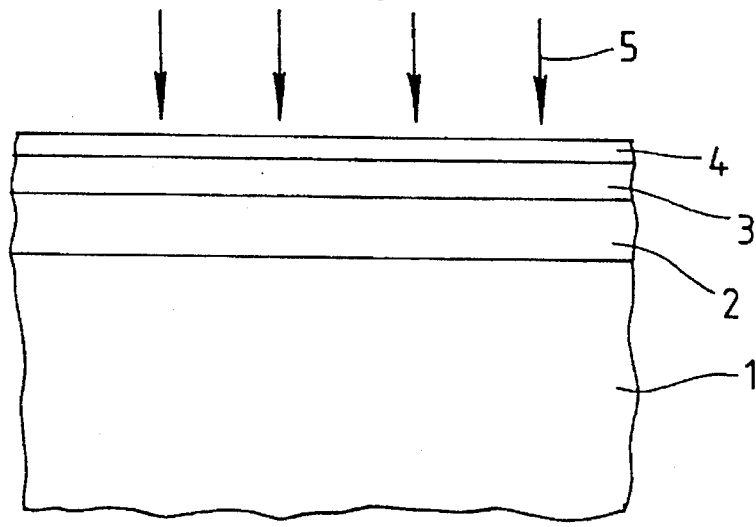

AS illustrated in FIG. 2(D), in order to reduce an anion deficiency believed to cause the leakage current in $Ta_2O_5$ layer 3, titanium ions 5 (Ti ions) are implanted into $Ta_2O_5$ layer 3, with silicon nitride layer 4 serving as a buffer layer.

The titanium ion implantation process is carried out with an energy of about 5 KeV–15 KeV, and a dosage of about $10^{13}$–$10^{16}$, using $Ti(OCH_3)_4$ as a titanium ion source.

Figure 2E:
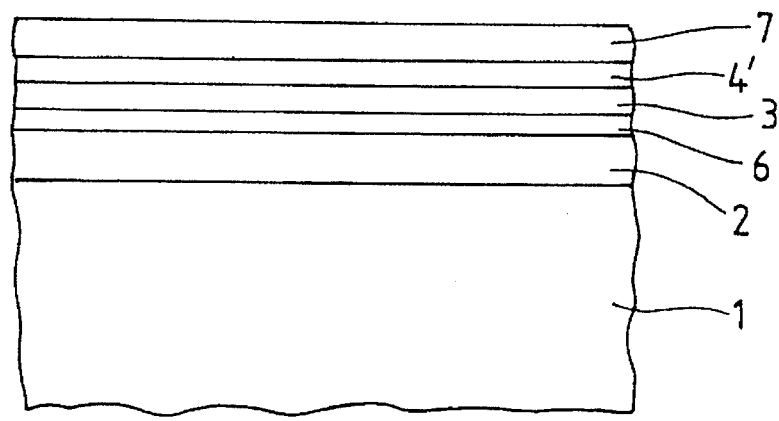

As illustrated in FIG. 2(E), a heat treatment is carried out by applying an oxidizing method for about 10 to 30 minutes at a temperature of about 700° to 900° C. During this heat treatment, silicon dioxide film 6 is formed between $Ta_2O_5$ layer 3 and the polysilicon layer of conductive material 2. In addition, silicon nitride layer 4 is changed to silicon oxynitride layer 4', which may include SiON and $Si_3N_4$, and which oxynitride layer effectively blocks flow of the positive holes. Some of the titanium atoms implanted are substituted for some of the Ta atoms in the $Ta_2O_5$ layer 3 and coupled to oxygen. Thus, the formerly $Ta_2O_5$ layer 5 is changed to a dielectric layer including $Ta_2O_5$ and $TiO_2$.

Second conductive layer 7, which functions as a second electrode of the capacitor, is deposited on oxynitride layer 4'.

According to the present invention as described above, a dielectric layer including $Ta_2O_5$ and $TiO_2$ may effectively decrease the leakage current. Without being bound by theory, the leakage current decrease appears related to the oxygen affinity of titanium, which is believed greater than that of Ta. Thus, titanium may react with oxygen instead of Ta. Titanium is believed to need less oxygen atoms than Ta to react, and dangling bonds of $Ta_2O_5$ due to lack of oxygen atoms may be removed by a titanium reaction. The capacitance of a capacitor obtained by the present invention may be increased because the total thickness of the dielectric layer composed by $SiO_2/Ta_2O_5/SiON$ can be made very thin, with acceptable leakage.

On the contrary, in the conventional technique, since $Ta_2O_5$ typically exists in a condition lacking oxygen atoms, such as a $Ta_2O_5$-x state, and thus dangling bonds of Ta typically exist in the $Ta_2O_5$ layer, these dangling bonds may act as charge trap sites resulting in large leakage current. In order to decrease the defects in the conventional art such as dangling bonds, a heat treatment at oxygen ambient is suggested to form a $SiO_2/Ta_2O_5/SiON$ layer. In the $SiO_2/Ta_2O_5/SiON$ layer, however, there still exist dangling bonds due to lack of oxygen atoms, and the thickness should be increased for reducing leakage current sufficiently.

Further, with the present invention $SiO_2/Ta_2O_5/SiON$ films are symmetrically formed on the sides of the $Ta_2O_5$ layer, and thus the flow of positive holes and the tunneling of electrons is prevented, thereby significantly reducing the leakage current.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method of making a capacitor in a semiconductor device comprising the steps of:
   (a) forming a first conductive layer on a substrate;
   (b) forming a tantalum oxide layer on the first conductive layer;
   (c) forming a silicon nitride layer on the tantalum oxide layer;
   (d) implanting titanium ions into the tantalum oxide layer;
   (e) carrying out a heat treatment, wherein a silicon oxide layer is formed between the first conductive layer and the tantalum oxide layer, wherein an oxide of titanium is formed in the tantalum oxide layer, and wherein the silicon nitride is converted to comprise an oxynitride layer; and
   (f) forming a second conductive layer on the oxynitride layer.

2. The method of claim 1, wherein the titanium ion implantation is carried out using $Ti(OCH_3)_4$ as a titanium ion source.

3. The method of claim 1, wherein the titanium ion implantation is carried out using the silicon nitride layer as a buffer layer, and the implantation is carried out with an energy of about 5 KeV and at a dosage of about $10^{13}$–$10^{16}$.

4. The method of claim 1, wherein the heat treatment is carried out in an oxygen atmosphere at a temperature of about 700°–900° C. for about 10–30 minutes.

5. The method of claim 1, wherein the silicon nitride layer is deposited to a thickness of about 10–30 Å.

6. The method of claim 1, wherein the first and second conductive layers comprise doped polysilicon.

7. A method of forming a capacitor in a semiconductor device comprising the steps of:
   (a) forming a first conductive layer on a substrate;
   (b) forming a tantalum oxide layer on the first conductive layer;
   (c) forming a silicon oxide layer on the tantalum oxide layer;
   (d) introducing titanium ions into the tantalum oxide layer using the silicon nitride layer as a buffer layer;
   (e) forming a silicon oxide layer between the first conductive layer and the tantalum oxide layer wherein the silicon nitride layer is converted to comprise an oxinitride layer; and
   (f) forming a second conductive layer on the oxynitride layer.

8. The method of claim 7, further comprising the step of forming an oxide of titanium in the tantalum oxide layer.

9. The method of claim 7, wherein the step of forming a silicon oxide layer between the first conductive layer and the tantalum oxide layer comprises a heat treatment, and wherein an oxide of titanium is formed in the tantalum oxide layer, and wherein the silicon nitride is converted to comprise an oxynitride layer.

10. The method of claim 7, wherein the step of introducing titanium ions comprises an ion implantation.

11. The method of claim 7, wherein the step of introducing titanium ions comprises an ion, implantation carried out using $Ti(OCH_3)_4$ as a titanium ion source.

12. The method of claim 7, wherein the step of introducing titanium ions comprises an ion implantation carried out using the silicon nitride layer as a buffer layer, and the implantation is carried out with an energy of about 5 KeV, at a dosage of about $10^{13}$–$10^{16}$.

13. The method of claim 9, wherein the heat treatment is carried out in an oxygen atmosphere at a temperature of about 700°–900° C. for about 10–30 minutes.

14. The method of claim 7, wherein the silicon nitride layer is deposited to a thickness of about 10–30 Å.

15. The method of claim 7, wherein the first and second conductive layers comprise doped polysilicon.

16. The method of claim 1, wherein the oxynitride layer comprises SiON and $Si_3N_4$.

* * * * *